(12) United States Patent
Agarwal et al.

(10) Patent No.: US 11,148,201 B2
(45) Date of Patent: Oct. 19, 2021

(54) ALUMINUM-BORON NITRIDE NANOTUBE COMPOSITES AND METHOD FOR MAKING THE SAME

(71) Applicants: Arvind Agarwal, Miami, FL (US); Benjamin Boesl, Plantation, FL (US); Pranjal Nautiyal, Miami, FL (US); Chris Rudolf, Miami, FL (US); Cheng Zhang, Hollywood, FL (US)

(72) Inventors: Arvind Agarwal, Miami, FL (US); Benjamin Boesl, Plantation, FL (US); Pranjal Nautiyal, Miami, FL (US); Chris Rudolf, Miami, FL (US); Cheng Zhang, Hollywood, FL (US)

(73) Assignee: THE FLORIDA INTERNATIONAL UNIVERSITY BOARD OF TRUSTEES, Miami, FL (US)

( * ) Notice: Subject to any disclaimer, the term of this patent is extended or adjusted under 35 U.S.C. 154(b) by 539 days.

(21) Appl. No.: 15/182,042

(22) Filed: Jun. 14, 2016

(65) Prior Publication Data

US 2017/0355021 A1 Dec. 14, 2017

(51) Int. Cl.
*B22F 7/02* (2006.01)
*B22F 3/105* (2006.01)
(Continued)

(52) U.S. Cl.
CPC ............... *B22F 7/02* (2013.01); *B22F 3/105* (2013.01); *B22F 3/18* (2013.01); *C22C 21/00* (2013.01);
(Continued)

(58) Field of Classification Search
CPC .................................. B22F 7/02; B22F 1/025
See application file for complete search history.

(56) References Cited

U.S. PATENT DOCUMENTS 4,045,857 A * 9/1977 Suzuki ............... B22F 3/18
419/6
8,206,674 B2 6/2012 Smith et al.
(Continued)

FOREIGN PATENT DOCUMENTS

WO WO-2010136899 A1 * 12/2010 ............. B23K 20/04

OTHER PUBLICATIONS

Trivedi, Sharma, Harsha, "Evaluations of young's modulus of boron nitride nanotube reinforced nano-composites". Procedia Materials Science, 6 (2014) 1899-1905. (Year: 2014).*

(Continued)

*Primary Examiner* — Keith Walker
*Assistant Examiner* — Catherine P Smith
(74) *Attorney, Agent, or Firm* — Saliwanchik, Lloyd & Eisenschenk

(57) ABSTRACT

Aluminum-boron nitride nanotube composites and methods of making thereof are disclosed herein. In at least one specific embodiment, the method can include: at least partially coating boron nitride nanotubes with aluminum to make an aluminum-boron nitride nanotube layered structure, where the at least partially coating is performed by sputter deposition, and where the boron nitride nanotubes have a length of about 100 μm to about 300 μm; sintering the aluminum-boron nitride nanotube layered structure to make an aluminum-boron nitride nanotube pellet, where the sintering is performed by spark plasma sintering; and rolling the aluminum-boron nitride nanotube pellet to make the aluminum-boron nitride nanotube composite.

15 Claims, 11 Drawing Sheets

(51) Int. Cl.
| | |
|---|---|
| B22F 3/18 | (2006.01) |
| C23C 14/18 | (2006.01) |
| C23C 14/58 | (2006.01) |
| C22C 47/06 | (2006.01) |
| C22C 21/00 | (2006.01) |
| C22C 47/04 | (2006.01) |
| C22C 47/02 | (2006.01) |
| B22F 1/02 | (2006.01) |
| B82Y 30/00 | (2011.01) |
| B82Y 40/00 | (2011.01) |

(52) U.S. Cl.
CPC ............ *C22C 47/025* (2013.01); *C22C 47/04* (2013.01); *C22C 47/06* (2013.01); *C23C 14/185* (2013.01); *C23C 14/5826* (2013.01); *C23C 14/5886* (2013.01); *B22F 1/025* (2013.01); *B22F 2998/10* (2013.01); *B82Y 30/00* (2013.01); *B82Y 40/00* (2013.01)

(56) References Cited

U.S. PATENT DOCUMENTS

| | | | |
|---|---|---|---|
| 2008/0132862 A1 | 6/2008 | Collias et al. | |
| 2010/0192535 A1* | 8/2010 | Smith | B82Y 30/00 57/243 |
| 2012/0273733 A1 | 11/2012 | Sainsbury et al. | |
| 2013/0306490 A1* | 11/2013 | Laubscher | D01F 9/12 205/766 |
| 2014/0256204 A1 | 9/2014 | Knoff | |
| 2014/0302579 A1* | 10/2014 | Boulanger | B01D 65/02 435/173.6 |
| 2015/0381020 A1* | 12/2015 | Wang | B22F 1/02 419/9 |
| 2017/0073797 A1* | 3/2017 | Otsuka | H01B 1/023 |

OTHER PUBLICATIONS

Amaguchi, M. etai, "Powder metallurgy routes toward aluminum boron nitride nanotube composites, their morphologies, structures and mechanical properties," Materials Science & Engineering, 2014, 604:9-17. (Year: 2014).*

Lahiri, D., Singh, V., Li, L., Xing, T., Seal, S., Chen, Y., & Agarwal, A. (2012). Insight into reactions and interface between boron nitride nanotube and aluminum. Journal of Materials Research, 27(21), 2760-2770. doi:10.1557/jmr.2012.294 (Year: 2012).*

Yanming Xue, "Aluminum matrix composites reinforced with multi-walled boron nitride nanotubes fabricated by a high-pressure torsion technique", Materials & Design, vol. 88, 2015, p. 451-460. (Year: 2015).*

D. Lahiri, "Dual strengthening mechanisms induced by carbon nanotubes in roll bonded aluminum composites", Materials Science and Engineering: A, vol. 523, 1-2, 2009, p. 263-270. (Year: 2009).*

Swain, R. E., Reifsnider, K. L., Jayaraman, K., & El-Zein, M. (1990). Interface/Interphase Concepts in Composite Material Systems. Journal of Thermoplastic Composite Materials, 3(1), 13-23. https://doi.org/10.1177/089270579000300102 (Year: 1990).*

A. Powell, The fabrication of aluminium-carbon nanotube metal matrix composites, School of Metallurgy and Materials, University of Birmingham, 2013, doi:10.1016/j.rinp.2016.04.013) (Year: 2013).*

A.S. Chen, "Deformation and damage mechanisms in fibre-reinforced aluminium alloy composites under tension", Composites Part A: Applied Science and Manufacturing, vol. 28, Issue 3, 1997, pp. 289-297. (Year: 1997).*

Agarwal, A. et al., "Carbon Nanotunes Reinforced Metal Matrix Composites," CRC Press, 2011, Abstract only.

Anselmi-Tamburini, U., et al. "Spark plasma sintering and characterization of bulk nanostructured fully stabilized zirconia: Part I. Densification studies," *J. Mater. Res.*, Nov. 2004, 19(11): 3255-3261.

Bakshi, S. et al., "An analysis of the factors affecting strengthening in carbon nanotube reinforced aluminum composites," 2011, 49:533-544.

Bakshi, S. et al., "Carbon nanotube reinforced metal matrix composites—a review," *International Materials Reviews*, 2010, 55(1):41-64.

Chen, Y., et al., "Boron nitride nanotubes: Pronounced resistance to oxidation," *Applied Physics Letters*, Mar. 29, 2004, 84(13):2430-3432.

Ferreira, T. et al., "A Novel Synthesis Route to Produce Boron Nitride Nanotubes for Bioapplications," *Journal of Biomaterials and Nanobiotechnology*, 2011, 2:426-434.

Ghassemi, H. et al., "In situ observation of reversible rippling in multi-walled boron nitride nanotubes," *Nanotechnology*, 2011, 22:1-6.

Golberg, D. et al., "Boron Nitride Nanotubes," *Advanced Materials*, 2007, Abstract only.

Goldberg, D. et al., "Synthesis And Characterization Of Ropes Made of BN Multiwalled Nanotubes," *Scripta mater*, 2001, 44:1561-1565.

Hansen, N. et al., "Hall-Petch relation and boundary strengthening," *Scripta Materialia*, 2004, 51:801-806.

Hedrick, T., "Software techniques for two- and three-dimensional kinematic measurements of biological and biomimetic systems," *Bioinsp. Biomim.*, 2008, 3:1-6.

Kim, K. et al., "Microstructures and tensile behavior of carbon nanotube reinforced Cu matrix nanocomposites," *Materials Science and Engineering*, 2006, 430:27-33.

Kuzumaki, T. et al., "Processing of Carbon Nanotube Reinforced Aluminum Composite," *Journals of Materials Research*, 1998, Abstract only.

Lahiri, D., et al., "Apatite formability of boron nitride nanotubes." *Nanotechnology*, 2011, 22:1-8.

Lahiri, D. et al., "Boron nitride nanotube reinforced hydroxyapatite composite: Mechanical and tribological performance and in-vitro biocompatibility to osteoblasts." *Journal of the Mechanical Behavior of Biomedical Materials*, 2011, 4:44-56.

Lahiri, D. et al., "Boron nitride nanotube reinforced polylactide-polycaprolactone copolymer composite: Mechanical properties and cytocompatibility with osteoblasts and macrophages in vitro." *Acta Biomaterialia*, 2010, 6:3524-3533.

Lahiri, D. et al., "Boron nitride nanotubes reinforced aluminum composites prepared by spark plasma sintering: Microstructure, mechanical properties and deformation behavior," *Materials Science & Engineering*, 2013, 574:149-156.

Lahiri, D. et al., "Insight into reactions and interface between boron nitride nanotube and aluminum," *Materials Research Society*, Nov. 14, 2012, 27(21):2760-2770.

Obraztsova, E.A. et al., "Metal ion implantation of multiwalled boron nitride nanotubes," *Scripta Materialia*, 2012, 67:507-510.

Ryu, H. et al., "Generalized shear-lag model for load transfer in SiC/Al metal-matrix composites," *J. Mater. Res.*, Dec. 2003, 18(12):2851-2858.

Singhal, S.K. et al., "Fabrication of Al-matrix composites reinforced with amino functionalized boron nitride nanotubes," *J Nanosci Nanotechnol.*, Jun. 2011, 11(6):5179—Abstract only.

Suryavanshi, A. et al., "Elastic modulus and resonance behavior of boron nitride nanotubes," *Applied Physics Letters*, 84(14): 2527-2529.

Tang, D. et al., "Mechanical Properties of Bamboo-like Boron Nitride Nanotubes by In Situ TEM and MD Simulations: Strengthening Effect of Interlocked Joint Interfaces," *ACS Nano*, Aug. 2011, 5(9): 7362-7368.

Tiano, A. et al., "Boron Nitride Nanotube: Synthesis and Applications," *NASA Technical Reports Server (NTRS)*, Document ID: 20140004051 (2014).

Wei, X. et al., "Tensile Tests on Individual Multi-Walled Boron Nitride Nanotubes," *Adv. Mater*, 2010, 22:4895-4899.

Xue, Y. et al., "Aluminum matrix composites reinforced with multi-walled boron nitride nanotubes fabricated by a high-pressure torsion technique," *Materials and Design*, 2015, 88:451-460.

(56) References Cited

OTHER PUBLICATIONS

Yamaguchi, M. et al., "Powder metallurgy routes toward aluminum boron nitride nanotube composites, their morphologies, structures and mechanical properties," *Materials Science & Engineering*, 2014, 604:9-17.

Yamaguchi, M. et al., "Synthesis, structural analysis and in situ transmission electron microscopy mechanical tests on individual aluminum matrix/boron nitride nanotube nanohybrids," *Acta Materialia*, 2012.

Yamaguchi, M. et al., "Utilization of multiwalled boron nitride nanotubes for the reinforcement of lightweight aluminum ribbons," *Nanoscale Research Letters*, 2013, 8:3.

\* cited by examiner

ALUMINUM-BORON NITRIDE NANOTUBE COMPOSITES AND METHOD FOR MAKING THE SAME

BACKGROUND

Considerable attention has been focused on carbon nanotube-metal matrix composites in the past decade due to their excellent load bearing capability, which is advantageous for structural applications [1, 2]. Strengthening of light-weight aluminum by carbon nanotube reinforcement has been pursued for aerospace and automotive applications [3]. For example, as the fuel economy restrictions are becoming stricter, reducing weight without compromising the strength is a major objective of the automobile industry. To fulfill customer satisfaction, improvements in the engine, vehicle interiors and add-ons for better safety, navigation and comfort features have to be included without adding to the automobile weight.

One of the key concerns with carbon nanotube for reinforcement is their relatively poor oxidation resistance at elevated temperatures; they undergo oxidation and disintegration at ~500° C. in air [4]. This poor thermal stability can limit the choice of processing conditions and fabrication routes feasible for making the carbon nanotubes composites. Alternative nanotube-metal matrix composites have been sought.

One alternative, boron nitride nanotube-metal matrix composite (BNNT-MMC), can be difficult to make because of the complications in high yield fabrication of the boron nitride nanotubes. However, new developments in high powered laser-based methods for the high yield fabrication of crystalline, small diameter and long boron nitride nanotubes (BNNTs) under high pressure and temperature can be promising for designing and developing new composites [10].

In recent years, a few research groups have studied BNNT reinforced aluminum composites, consolidated by various techniques [11-18]. Spark plasma sintering (SPS) is one such technique that can be desirable because it involves lower sintering temperatures and soaking times as compared to other techniques [19]. Spark plasma sintering can restrict grain growth and can result in superior mechanical properties (Hall-Petch relationship [20]). Spark plasma sintering of bulk Al-BNNT composites have been reported for the first time [15], employing "bamboo-shaped" BNNTs, which resulted in a 50% improvement in yield stress and compressive strength. However, based on in-situ transmission electron microscopy (TEM) mechanical testing, Yamaguchi and co-workers argued that bamboo-shaped nanotubes are mechanically weak, and proposed that crystallized nested BNNTs could be a better reinforcement for effective strengthening [21].

Subsequently, Al matrix composites reinforced with these tubular BNNTs (10-20 μm long) were reported by the same group by employing SPS and high-pressure torsion (HPT) methods for consolidation [17, 22]. These spark plasma sintered Al-BNNT composites, however, displayed hardness inferior to unreinforced aluminum; the drawback was ascribed to the microporosity and preferential migration of BNNT to the grain boundaries in the composites.

There is a need, therefore, for new aluminum-boron nitride nanotube composites with useful strength characteristics for structural applications.

BRIEF SUMMARY

Provided herein are aluminum-boron nitride nanotube composites and methods of making the same. In at least one specific embodiment, an aluminum-boron nitride nanotube composite can include aluminum and boron nitride nanotubes, where the boron nitride nanotubes have a length of about 100 μm to about 300 μm.

In another specific embodiment, an aluminum-boron nitride nanotube composite can be prepared by a process that can include the steps of: at least partially coating boron nitride nanotubes with aluminum to make an aluminum-boron nitride nanotube layered structure, where the at least partial coating is performed by sputter deposition, and where the boron nitride nanotubes have a length of about 100 μm to about 300 μm; and sintering the aluminum-boron nitride nanotube layered structure to make an aluminum-boron nitride nanotube pellet, where the sintering is performed by spark plasma sintering; and rolling the aluminum-boron nitride nanotube pellet to make the aluminum-boron nitride nanotube composite.

In another specific embodiment, a method of making an aluminum-boron nitride nanotube composite can include at least partially coating boron nitride nanotubes with aluminum to make an aluminum-boron nitride nanotube layered structure, where the at least partially coating is performed by sputter deposition, and where boron nitride nanotubes have a length of about 100 μm to about 300 μm; and sintering the aluminum-boron nitride nanotube layered structure to make an aluminum-boron nitride nanotube pellet, where the sintering is performed by spark plasma sintering; and rolling the aluminum-boron nitride nanotube pellet to make the aluminum-boron nitride nanotube composite.

BRIEF DESCRIPTION OF THE FIGURES

In the following detailed description, reference is made to the accompanying figures, depicting exemplary, non-limiting and non-exhaustive embodiments of the invention. So that the manner in which the above-recited features of the present invention can be understood in detail, a more particular description of the invention, briefly summarized above, can be had by reference to the embodiments, some of which are illustrated in the appended figures. It should be noted, however, that the appended figures illustrate only certain embodiments of this invention and are, therefore, not to be considered limiting of its scope.

FIG. 6A the crack bridging due to directionally aligned BNNTs, and FIG. 6B the enlarged view of a BNNT network acting as crack bridges along the entire depth of the crack section.

DETAILED DISCLOSURE

Figure 1A:
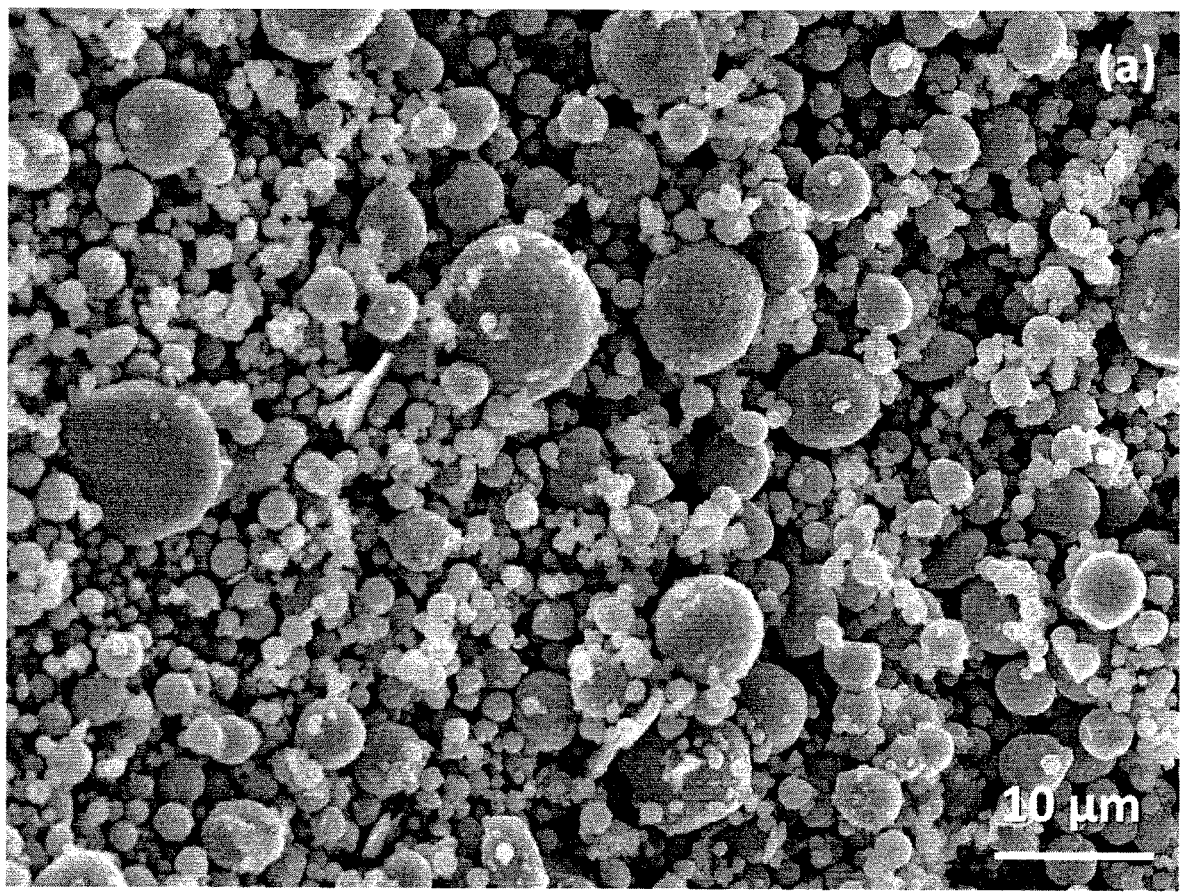
FIGS. 1A-1C depict field emission scanning electron microscopy (FESEM) images of FIG. 1A the aluminum powder (H3, Valimet Inc., Stockton, Calif.), FIG. 1B the dense cluster of high aspect ratio boron nitride nanotubes (inset shows them as a received ball of entangled BNNTs), and FIG. 1C the Fourier transform infrared spectroscopy (FTIR) spectrum of BNNTs (BNNT P1 Beta, BNNT, LLC, Newport News, VA).

Aluminum-boron nitride nanotube composites and methods of making the same are disclosed herein. The aluminum-boron nitride nanotube composites can be described as "Al-BNNT-Al composites," "layered Al-BNNT-Al composites," "aluminum and boron nitride nanotube composites," "Al-BNNT composites," "boron nitride nanotube based aluminum matrix composites," and "Al-BNNT-Al sandwich composites."

The aluminum-boron nitride nanotube composites can include long boron nitride nanotubes. The aluminum-boron nitride nanotube composites that can include long boron nitride nanotubes have surprising and advantageous properties. For example, the aluminum-boron nitride nanotube composites with long boron nitride nanotubes have advantageous tensile strength. The aluminum-boron nitride nanotube composites with long boron nitride nanotubes have high tensile strength when compared with aluminum-boron nitride nanotube composites made with shorter boron nitride nanotubes.

Without wanting to be bound by theory, it is believed that the strengthening can be explained by three mechanisms: effective load transfer of the long boron nitride nanotube reinforcement, improvement in matrix-nanotube bonding due to a trace amount of interfacial product formation, and strengthening due to the formation Al-BNNT clusters, which manifests as multi-stage yielding. The load transfer can occur through interfacial shear stresses between the aluminum matrix and the boron nitride nanotubes, which act as crack-bridges when the composite is subjected to tensile loading. The long BNNTs can increase the interfacial bonding, which in turn increases the strength, such as tensile strength, of the aluminum-boron nitride nanotube composites. Formation of Al-BNNT clusters and reaction products, such as AlN and $AlB_2$, at the interface of the Al and BNNT layers can provide strong interfacial interactions between the matrix and the secondary reinforcement. Conversely, if there is poor interfacial bonding between the aluminum matrix and the boron nitride nanotubes, then there will be less strengthening in the composite's load bearing capability.

The aluminum-boron nitride nanotube composite can have a tensile strength from a low of about 100 MPa, about 120 MPa, or about 150 MPa, to a high of about 400 MPa, about 500 MPa, or about 600 MPa. For example, the aluminum-boron nitride nanotube composites can have a tensile strength from about 100 MPa to about 600 MPa, about 100 MPa to about 200 MPa, about 110 MPa to about 150 MPa, about 120 MPa to about 220 MPa, about 140 MPa to about 250 MPa, about 150 MPa to about 300 MPa, about 175 MPa to about 280 MPa, about 195 MPa to about 205 MPa, about 190 MPa to about 230 MPa, about 198 MPa to about 500 MPa, about 198 MPa to about 500 MPa, about 210 MPa to about 600 MPa, about 200 MPa to about 500 MPa, or about 400 MPa to about 590 MPa.

The aluminum-boron nitride nanotube composite can have a Young's modulus from a low of about 90 GPa, or about 100 GPa, or about 110 GPa, to a high of about 150 GPa, about 175 GPa, or about 200 GPa. For example, the aluminum-boron nitride nanotube composites can have a Young's modulus from about 90 GPa to about 200 GPa, about 100 GPa to about 140 GPa, about 100 GPa to about 160 GPa, about 120 GPa to about 137 GPa, about 125 GPa to about 140 GPa, about 125 GPa to about 165 GPa, about 130 GPa to about 170 GPa, about 130 GPa to about 190 GPa, about 132 GPa to about 200 GPa, or about 135 GPa to about 160 GPa.

For example, the aluminum-boron nitride nanotube composite can have boron nitride nanotubes in amounts from a low of about 0.2 vol %, about 0.5 vol %, or about 1 vol %, to a high of about 5 vol %, about 10 vol %, or about 20 vol %, based on the total volume of the aluminum-boron nitride nanotube composite. For example, the aluminum-boron nitride nanotube composite can have boron nitride nanotubes in an amount from about 0.2 vol % to about 20 vol %, about 0.2 vol % to about 1 vol %, about 0.2 vol % to about 3 vol %, about 0.5 vol % to about 3 vol %, about 0.5 vol % to about 5 vol %, about 1 vol % to about 2 vol %, about 1 vol % to about 7 vol %, about 1.5 vol % to about 2.5 vol %, about 1.5 vol % to about 6.5 vol %, about 2 vol % to about 11 vol %, about 2 vol % to about 15 vol %, about 3 vol % to about 9 vol %, about 3 vol % to about 17 vol %, or about 5 vol % to about 12 vol %, based on the total volume of the aluminum-boron nitride nanotube composite.

The aluminum-boron nitride nanotube composites can include aligned boron nitride nanotubes. For example, the aluminum-boron nitride nanotube composites can have 80% of the boron nitride nanotubes deviate less than ±2°, less than ±5°, or less than ±90 from a reference line parallel to the highly-aligned boron nitride nanotubes. In another example, the aluminum-boron nitride nanotube composites can have 96% of the boron nitride nanotubes deviate no more than ±2°, no more than ±5°, or more than ±9° from a reference line parallel to the highly-aligned boron nitride nanotubes. In yet another example, the aluminum-boron nitride nanotube composites can have 99% of the boron nitride nanotubes deviate less than than ±2°, less than ±50, or less ±10° from a reference line parallel to the highly-aligned boron nitride nanotubes.

The aluminum-boron nitride nanotube composites can be used to make a wide variety of products. In particular, the aluminum-boron nitride nanotube composites can be used to make products that need good load bearing capabilities. Due to their oxidation resistance at elevated temperatures, the aluminum-boron nitride nanotube composites can be fabricated and processed by employing high temperature techniques, such as casting, hot extrusion, hot rolling, hot forging and hot drawing to make the products.

The aluminum-boron nitride nanotube composite can be used for aerospace and automotive applications. The lightweight, high-strength aluminum-boron nitride nanotube composites may be used to replace steel for making, for example, chassis, door beams, roofs, and body panels. For example, the aluminum-boron nitride nanotube composite can be used to make aircraft components, such as ribs of wings, bearings, flap track, flap carriage, wing support structures and struts.

The method of making the aluminum-boron nitride nanotube composite can include, but is not limited to, at least partially coating boron nitride nanotubes with aluminum to make an aluminum-boron nitride nanotube layered structure. The aluminum-boron nitride nanotube layered structure can be consolidated to make an aluminum-boron nitride nanotube pellet. Rolling the aluminum-boron nitride nanotube pellet can make the aluminum-boron nitride nanotube composite with aligned boron nitride nanotubes The at least partially coating of the boron nitride nanotubes with aluminum to make the aluminum-boron nitride nanotube layered structure can be performed using various conventional techniques. In one example, the at least partially coating of the boron nitride nanotubes with aluminum can be performed by mixing and/or layering aluminum powder on the boron nitride nanotubes. In another example, the at least partially coating of the boron nitride nanotubes with aluminum can be performed by sputter deposition.

The boron nitride nanotubes can be formed into a boron nitride nanotube mat or layer before at least partially coating with aluminum. For example, the boron nitride nanotubes can be formed into a boron nitride nanotube mat by using a knife or cutting tool to make a small incision on the exterior surface of the boron nitride nanotubes felt to initiate layer removal and then tweezers can be used to separate a thin layer of boron nitride nanotube mat. Broad edge tweezers can be used to stretch the boron nitride nanotube mat in the longitudinal direction. Tweezers can be placed on either edge of the mat and pulled. The boron nitride nanotube mat can then be rotated and stretched around its circumference. A circular knife or cutting tool can be used to cut a cylindrical section of the boron nitride nanotube mat that can fit to the sizing of the spark plasma sintering dies and punches. The boron nitride nanotube mat can function as a high strength supporting frame. Such a structure can be a sandwich composite, where a layer of aligned nanotubes in Al matrix induces strengthening.

The sputter coating deposition of the aluminum on the boron nitride nanotubes to form an aluminum-boron nitride nanotube layered structure can increase the interfacial bonding prior to the spark plasma sintering consolidation to form the aluminum-boron nitride nanotube composites. The sputter coating can use high energy aluminum ions to bombard a boron nitride nanotube mat, which can result in penetrative mechanical bonding of a thin aluminum layer on the boron nitride nanotube mat to form an aluminum-boron nitride nanotube layered structure.

The consolidating of the aluminum-boron nitride nanotube layered structure to make the aluminum-boron nitride nanotube pellet can be performed using many different conventional techniques. The consolidating of the aluminum-boron nitride nanotube layered structure can be consolidated by applying heat and/or pressure. In one example, the consolidating of the aluminum-boron nitride nanotube layered structure can be performed by sintering, such as spark plasma sintering.

The consolidation of the aluminum-boron nitride nanotube pellet by spark plasma sintering can induce interfacial product formation. This method can yield strong interfacial bonding due to a combination of mechanical and/or physical bonding as well as interphase strengthening by the Al-BNNT clusters and reaction products, such as AlN and $AlB_2$. Post-consolidation rolling, such as cold rolling, of the aluminum-boron nitride nanotube pellet can produce directional alignment of the long boron nitride nanotubes, which can impart more strength to the aluminum-boron nitride nanotube composite.

The rolling of the aluminum-boron nitride nanotube pellet to make the aluminum-boron nitride nanotube composite can be performed with many different conventional techniques. For example, the rolling of the aluminum-boron nitride nanotube pellet can be performed using cold rolling and/or hot rolling. The rolling can result in the alignment of the boron nitride nanotubes within the aluminum-boron nitride nanotube composite.

The boron nitride nanotubes can survive high temperatures, pressures and severe deformation conditions of spark plasma sintering and rolling, and can also yield good alignment along the rolling direction. The boron nitride nanotubes can have large mechanical strength, high oxidation resistance, high flexibility and low density, which makes them a good reinforcement material to enhance the strength of light weight structural metals, such as aluminum. The boron nitride nanotubes can have an oxidation resistance of less than about 1,100 K, less than about 1,000 K, or less than about 900 K. The boron nitride nanotubes can have a reversible buckling up to about 26% strain. The boron nitride nanotubes can have an elastic modulus equal to or greater than about 1 TPa. The boron nitride nanotubes can have a density from about 0.25 g/cc to about 2.0 g/cc. The boron nitride nanotubes can have a mechanical strength from a low of about 45 GPa, about 50 GPa, or about 55 GPa, to a high of about 65 GPa, about 70 GPa, or about 75 GPa. For example, the boron nitride nanotubes can have a mechanical strength from about 45 GPa to about 75 GPa, about 45 GPa to about 65 GPa, about 50 GPa to about 70 GPa, about 55 GPa to about 65 GPa, about 60 GPa to about 65 GPa, or about 60 GPa to about 75 GPa.

The boron nitride nanotubes can have a diameter from a low of about 2 nm, about 3 nm, about 4 nm, to a high of about 5 nm, about 6 nm, or about 7 nm. For example, the boron nitride nanotubes can have a diameter from about 2 nm to about 7 nm, about 2 nm to about 5 nm, about 3 nm to about 6 nm, about 4 nm to about 6 nm, or about 4 nm to about 7 nm.

The boron nitride nanotubes can include long boron nitride nanotubes. The boron nitride nanotubes can have a length from a low of about 100 μm, about 110 μm, or about 120 μm, to a high of about 190 μm, about 200 μm, or about 300 μm. For example, the boron nitride nanotubes can have a length from about 100 μm to about 110 μm, about 100 μm to about 200 μm, about 100 μm to about 300 μm, about 105 μm to about 115 μm, about 110 μm to about 150 μm, about 110 μm to about 170 μm, about 120 μm to about 180 μm, about 114 μm to about 187 μm, about 120 μm to about 217 μm, about 130 μm to about 290 μm, about 140 μm to about 190 μm, about 140 μm to about 260 μm, about 180 μm to about 220 μm, about 190 μm to about 210 μm, or about 200 μm to about 298 μm. In another example, the boron nitride nanotubes can have a length greater than 100 μm, greater than 120 μm, or great than 160.

The boron nitride nanotubes can have an average length from a low of about 100 μm, about 110 μm, or about 120 μm, to a high of about 190 μm, about 200 μm, or about 300 μm. For example, the boron nitride nanotubes can have an average length from about 100 μm to about 110 μm, about 100 μm to about 200 μm, about 100 μm to about 300 μm, about 105 μm to about 115 μm, about 110 μm to about 150 μm, about 110 μm to about 170 μm, about 120 μm to about 180 μm, about 114 μm to about 187 μm, about 120 μm to about 217 μm, about 130 μm to about 290 μm, about 140 μm to about 190 μm, about 140 μm to about 260 μm, or about 200 μm to about 298 μm. In another example, the boron nitride nanotubes can have an average length of greater than 100 μm, greater than 120 μm, or great than 160.

The boron nitride nanotubes can have an aspect ratio from a low of about 30,000, about 35,000, or about 40,000, to a high of about 60,000 about 65,000, or about 75,000. For example, the boron nitride nanotubes can have an aspect ratio of about 30,000 to about 75,000, about 30,000 to about 35,000, about 30,000 to about 55,000, about 35,000 to about 65,000, about 32,000 to about 45,000, about 40,000 to about 72,000, about 40,000 to about 52,000, about 45,000 to about 62,000, about 45,000 to about 70,000, about 50,000 to about 60,000, about 50,000 to about 72,000, or about 60,000 to about 70,000.

The boron nitride nanotubes can be made by a variety of manufacturing processes. For example, the boron nitride nanotubes can be prepared using a liquid exfoliation method. The procedure can include, but is not limited to, those discussed and described in the article, J. N. Coleman, M. Lotya, A. O'Neill, S. D. Bergin, P. J. King, U. Khan, K. Young, A. Gaucher, S. De, R. J. Smith, I. V. Shvets, S. K. Arora, G. Stanton, H. Y. Kim, K. Lee, G. T. Kim, G. S. Duesberg, T. Hallam, J. J. Boland, J. J. Wang, J. F. Donegan, J. C. Grunlan, G. Moriarty, A. Shmeliov, R. J. Nicholls, J. M. Perkins, E. M. Grieveson, K. Theuwissen, D. W. McComb, P. D. Nellist and V. Nicolosi: "Two-dimensional nanosheets produced by liquid exfoliation of layered materials," *Science*, 2011, 331, (6017), 568-571, which is hereby incorporated by reference in its entirety.

In the liquid phase exfoliation technique, h-BN powder can be dispersed in a highly polar solvent, such as N-methyl-2-pyrrolidone, with a concentration of about 100 mg mL$^{-1}$ using a high power tip sonicator, such as a CV33 flat probe sonic tip at 50 W at 25 kHz for 24 h. The suspension can be surrounded by an ice bath. The sonicated suspension can be centrifuged at, for example, 500 rotations for about 45 min to separate the supernatant containing lighter boron nitride nanotubes from the bulk powder that settled. The supernatant can be filtered by vacuum filtration process, and the dried boron nitride nanotubes can be collected and washed with ethanol and water several times.

In another manufacturing process, the boron nitride nanotubes can be made by providing a boron-containing target in a chamber under nitrogen pressure, which is elevated above atmospheric pressure; and thermally exciting a boron-containing target. The boron-containing target can include, but is not limited to, a compressed boron powder or compressed boron nitride powder. The target can be cylindrical, rotating, and illuminated on the radius, or cylindrical, rotating, and illuminated on one face, or the target can be stationary. This manufacturing process can include, but is not limited to: creating a source of boron vapor; mixing the boron vapor with nitrogen gas so that a mixture of boron vapor and nitrogen gas is present at a nucleation site, the nitrogen gas can be provided at a pressure that is greater than about 2 atmospheres but less than about 250 atmospheres; and harvesting boron nitride nanotubes, which are formed at the nucleation site.

The source of boron vapor can be made by providing energy to a solid boron-containing target, the energy being sufficient to break the bonds in the solid boron-containing target, which allows the boron to enter the vapor state. This energy can be thermal energy, which can be provided by a laser directed at the solid boron-containing target. The laser can be, for example, a free electron laser and a carbon dioxide laser. The laser beam can be directed at the solid boron-containing target, drilling a hole in the solid boron-containing target creating a stream of boron vapor by heating inside the hole. The laser beam can be, for example, 1.6 micron wavelength, 8 mm diameter, unfocused, 1 kW, beam. The laser beam can propagate vertically downward into the solid boron-containing target. The target, a 2.5 cm diameter plug of pressed boron metal powder can rotate on a turntable at 20 sec/revolution. The center of rotation of the target can be offset by about a half beam diameter from the center of the beam, so that the laser drills a hole about twice its diameter as the target spins. An ambient temperature nitrogen gas can be fed into the synthesis chamber continuously.

The stream of boron vapor can be allowed to flow upwardly from the bottom of the hole, after which it contacts the nitrogen gas making the boron nitride nanotubes. The nitrogen gas can be kept under pressure in a synthesis chamber that encloses the solid boron-containing target and contains the nitrogen gas under pressure. Nitrogen gas can be used at a pressure greater than about 2 atmospheres but less than about 250 atmospheres. For example, the nitrogen gas can have a pressure from about 2 atmospheres up to about 12 atmospheres. The boron nitride nanotubes can be harvested by conventional means. The boron nitride nanotubes can have a growth rate of about 10 cm/sec.

In another manufacturing process, the boron nitride nanotubes can be made by a catalyst enhanced ball milling and annealing. In this process, nanosize ball-milled boron particles are mixed with metal nitrate in ethanol to form an ink-like solution, and then the ink is annealed in nitrogen-containing gas to form nanotubes. This process can improve the yield of BNNTs, and give a higher density of nanotubes by the addition of metal nitrate and ethanol. The size and structure of BNNTs can be controlled by varying the annealing conditions. This high-yield production of BNNTs can allow for large-scale application of BNNTs.

The boron nitride nanotubes can be crystalline nanotubes having continuous, parallel, and sp2 bonded walls. These nanotubes can be single-walled nanotubes, double-walled nanotubes, few-walled nanotubes, and multi-walled nanotubes. Boron nitride nanotubes can have various shapes. For example, the shape of the boron nitride nanotubes can include, but are not limited to: nodular or bamboo type, cylindrical tubes, and rods.

Boron nitride nanotubes can include commercially available boron nitride nanotubes. Commercially available boron nitride nanotubes can include, but are not limited to, those manufactured by BNNT, LLC (Newport News, VA), such as BNNT P1 Beta boron nitride nanotubes.

The aluminum used to make the aluminum-boron nitride nanotube composites can come in many forms. For example, the aluminum can be a solid, liquid, solution, and/or gas. The liquid form can be molten aluminum. The solid form of aluminum can be a powder, where the powder is composed of particles. The aluminum powder can have particles that vary widely in diameter. For example, the aluminum powder can have particles in which 90% of the particles have a diameter less than about 10.5 μm, about 9.5 μm, or about 8.5 μm. In another example, the aluminum powder can have particles in which 70% of the particles have a diameter less than about 10.5 μm, about 9.5 μm, or about 8.5 μm. In another yet example, the aluminum powder can have particles in which 90% of the particles have a diameter from a small of about 5 μm, about 6 μm, or about 7 μm, to a large of about 12 μm, about 20 μm, or about 50 μm. For example, the aluminum powder can have particles in which 90% of the particles have a diameter from about 5 μm to about 50 μm, about 5 μm to about 20 μm, about 5 μm to about 50 μm, about 8 μm to about 16 μm, about 9 μm to about 24 μm, about 10 μm to about 30 μm, about 10 μm to about 43 μm, or about 14 μm to about 48 μm.

The aluminum can include commercially available aluminum. Commercially available aluminum can include, but is not limited to, those manufactured by Valimet Inc. (Stockton, Calif.), such as H3.

Examples

The examples and embodiments described herein are for illustrative purposes only and various modifications or changes in light thereof will be suggested to persons skilled in the art and are included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

Aluminum-Boron Nitride Nanotube Composite

Figure 1B:
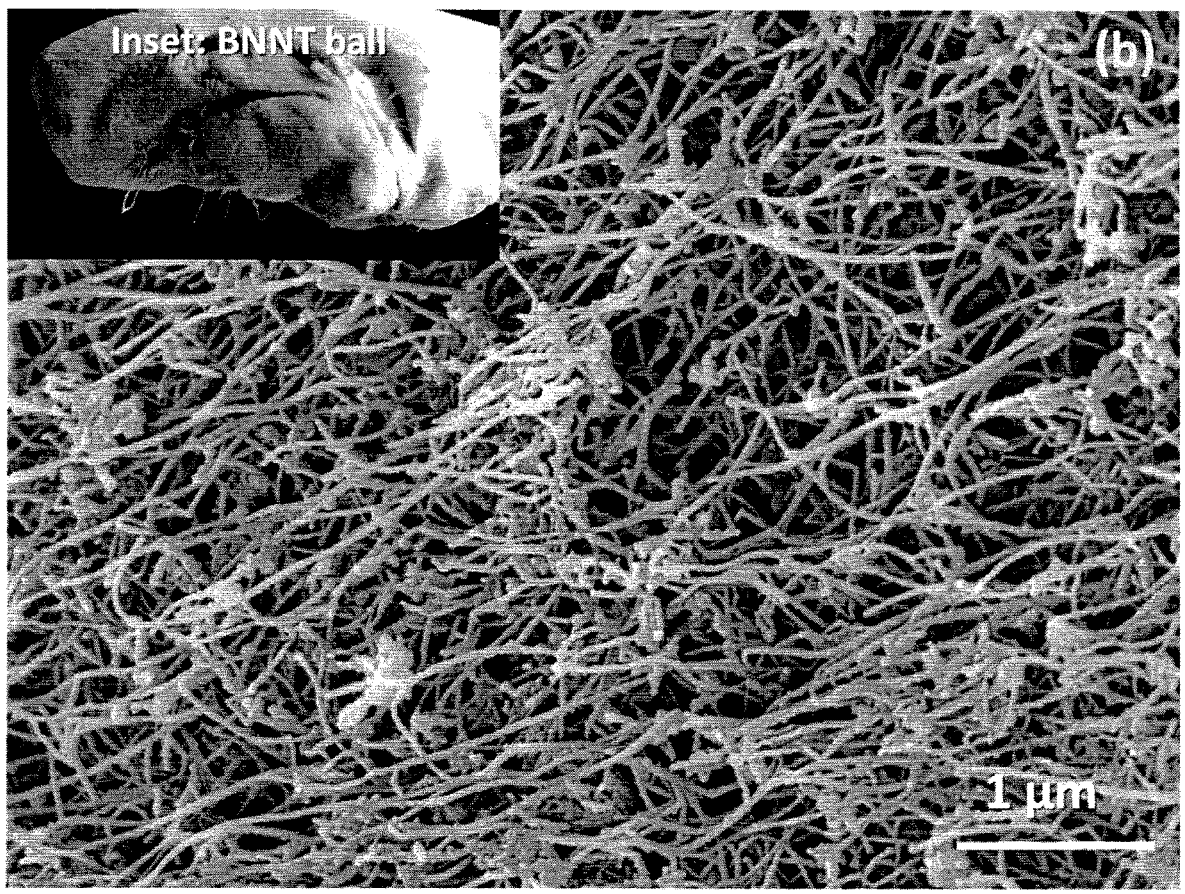
Figure 1C:
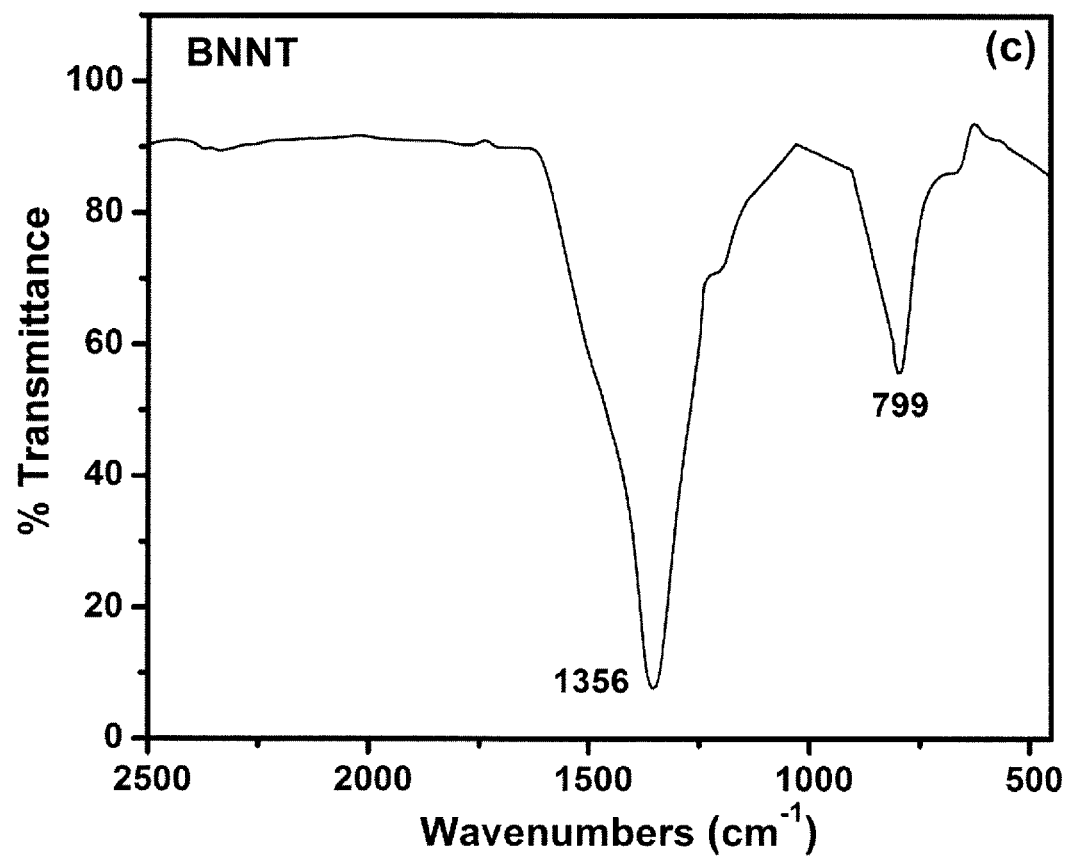

Spherical aluminum powder (H3, Valimet Inc.) that included more than 99.7 wt % aluminum with 90% of the particles having a diameter of less than 10.5 μm was used (FIG. 1A. Boron nitride nanotubes (BNNT P1 Beta) were obtained from BNNT, LLC. The boron nitride nanotubes were received in the form of lightweight balls, which included densely entangled long and fine nanotubes, with a tapping density of about 0.5 mg/cm$^3$. These boron nitride nanotubes were from one to five walls thick with two or three walls being the most common. The boron nitride nanotubes' diameters were 3-6 nm, and their lengths were as long as 200 μm with an aspect ratio from about 30,000 to about 70,000 [10]. The scanning electron microscopy (SEM) image of the dense nanotube cluster is shown in FIG. 1B. Inset of the figure shows the as-received BNNT ball. Fourier transform infrared spectroscopy (FTIR) plot of as-received BNNT shows the characteristic h-BN peaks [23] around 1356 cm$^{-1}$ and 799 cm$^{-1}$ (FIG. 1C).

A thin layer of BNNT mat was formed by cutting and stretching the lightweight BNNT balls. The mat was placed with the Al powder (total weight 2.5 g) in an SPS graphite die of 20 mm diameter to make an aluminum-boron nitride nanotube layered structure. The BNNT was about 2 vol. % of the aluminum-boron nitride nanotube layered structure. The aluminum-boron nitride nanotube layered structure was spark plasma sintered at a maximum temperature of 575° C., heating rate of 100° C./min and an applied pressure of 80 MPa for 1 hour. Temperatures, pressures and sintering times were chosen to promote strong inter-layer bonding between the three layers, i.e, aluminum/BNNT mat/aluminum, of the resulting aluminum-boron nitride nanotube pellet.

Figure 2:
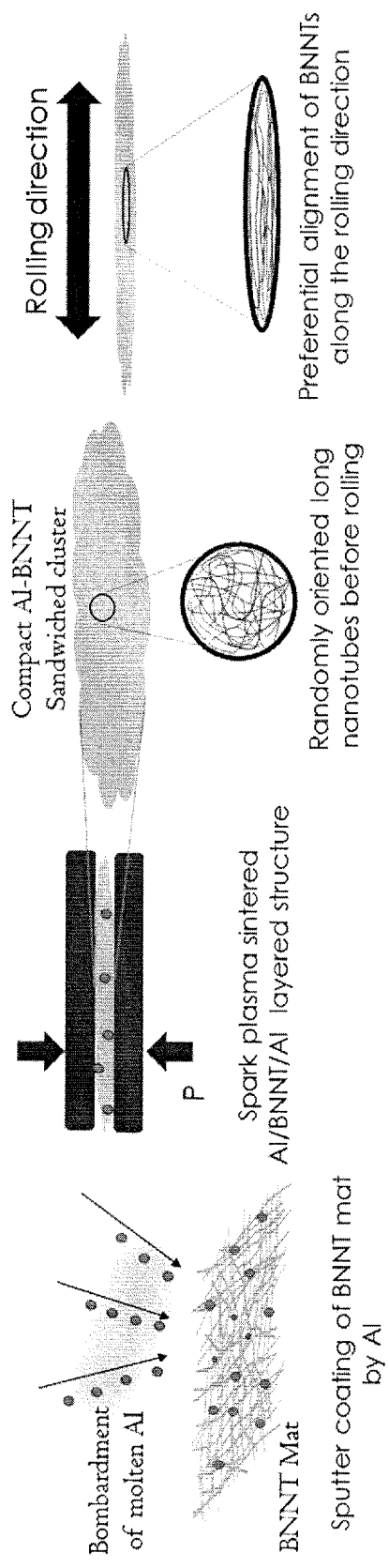
FIG. 2 is a schematic representation of the process of aligning the long BNNTs in the aluminum-boron nitride nanotube pellet at each stage.
Figure 2:
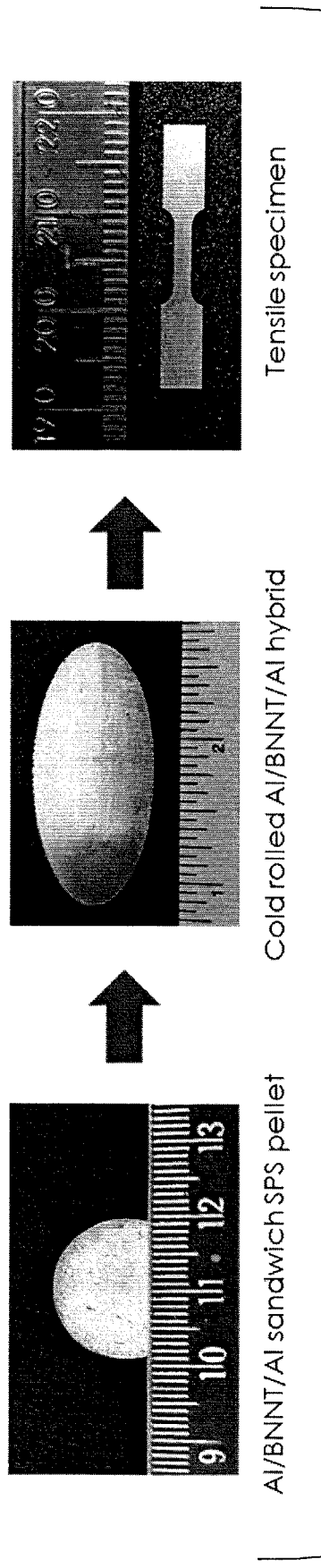

The aluminum-boron nitride nanotube pellet was then cold-rolled with two passes at room temperature, reducing the thickness by about 55% to make an aluminum-boron nitride nanotube composite. The aluminum-boron nitride nanotube composite displayed good deformability, with no cracking or disintegration due to cold rolling. The cold rolling promoted the interfacial bonding, and at least partially aligned the long BNNTs sandwiched between the Al layers. Dog-bone tensile specimens were cut out from the cold rolled sheet by wire electrical discharge machining (EDM). Schematic representation of the fabrication process and pictures of samples at each stage are shown in FIG. 2.

Characterization

X-ray diffraction (XRD) was carried out on the aluminum-boron nitride nanotube composite to examine any reaction taking place at the Al/BNNT interface. XRD was performed using Siemens D-5000 X-ray diffractometer (Munich, Germany), based on CuK$_\alpha$ radiation at an operating voltage and current of 40 kV and 35 mA, respectively.

A uniaxial tensile test was carried out in a MTI SEMtester (Albany, N.Y.), with a 445 N capacity load cell. The samples were loaded at the constant displacement rate of 1 mm/min. The test was conducted at ambient temperature. A test video was recorded by a Dino-Lite AM2111 digital microscope (New Taipei City, Taiwan) for strain measurement and analysis. The software outputs data as load-displacement curve. Stress-strain curve was derived from the load-displacement data. The stress was determined by dividing loads with cross sectional area of tensile specimen. The strain was computed by video correlation MATLAB program, developed in Hedrick Lab, University of North Carolina (Chapel Hill, N.C.) [24].

Post failure sample imaging was performed using JEOL JSM-6330F field emission SEM (Tokyo, Japan), at an operating voltage of 10 kV and a working distance of 15 mm. SEM images of fracture surface were captured to observe the BNNT pull-out. In addition, interface between layers was also imaged to elucidate matrix strengthening induced by the long nanotubes.

A stress-strain curve was found to exhibit three-stage yielding of the layered composite, which can be associated with the yielding of the Al matrix, debonding of interfacial products and failing of the BNNTs, respectively. Effective crack bridging was also exhibited by directionally aligned long BNNTs.

Interfacial Reaction Products

Figure 3:
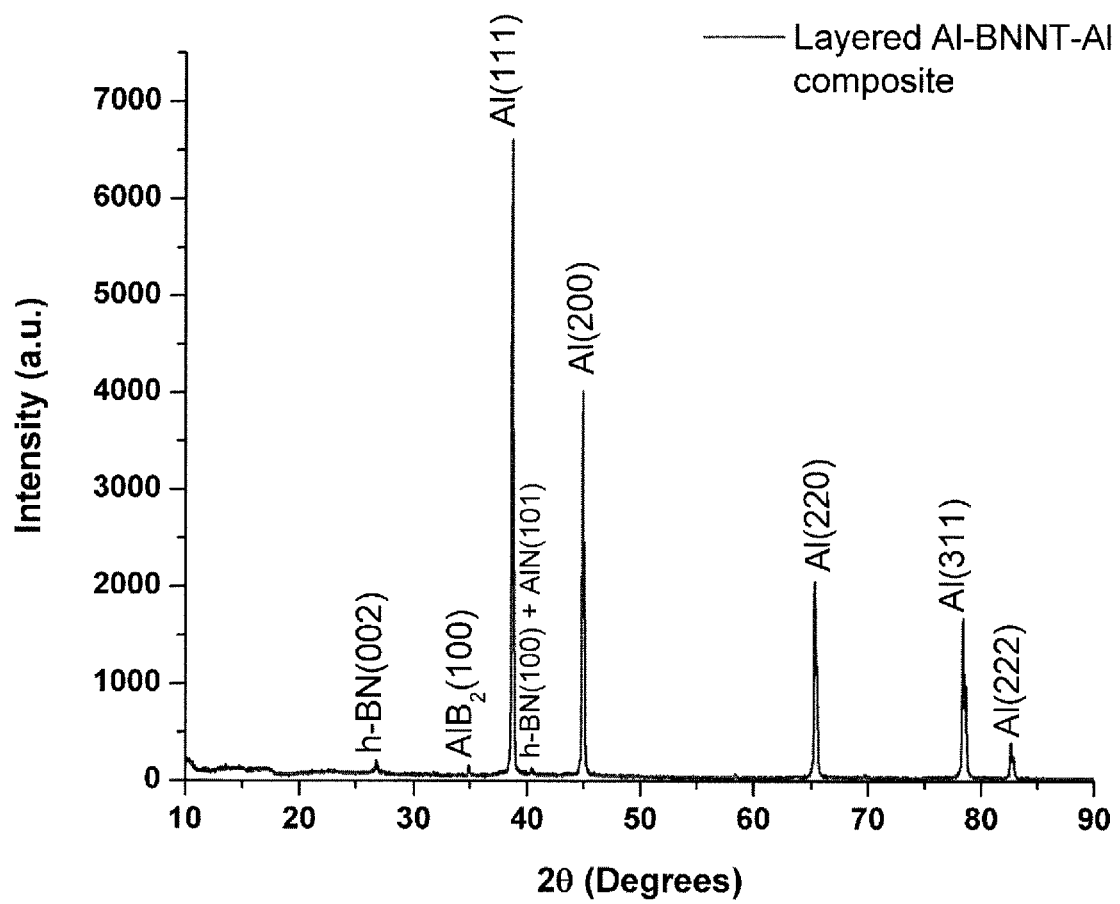
FIG. 3 is an X-ray diffraction pattern for the aluminum-boron nitride nanotube composite.

An X-ray diffraction pattern of the aluminum-boron nitride nanotube composite is shown in FIG. 3. Peaks corresponding to h-BN show that these long BNNTs survived high temperature (575° C.), high pressure (about 80 MPa) and long sintering time (about 1 hr) involved in SPS. In addition, weak peaks for AlN and AlB$_2$ were detected, which suggests interfacial reactions taking place between the Al and BNNT layers. It is noteworthy that Lahiri et al. did not report any interfacial product formation for bamboo-shaped BNNT reinforced Al composite consolidated by SPS [15]. This could be related to lower sintering temperature (500° C.) employed in that study. Yamaguchi et al.'s study involved SPS at 550° C.; but since the sintering time was relatively low (~20 min), they too did not detect any reaction products [17]. Lahiri and co-workers reported interfacial products for furnace sintering in an Ar atmosphere, but the reaction was slow, and new products could be noticed only after 2 hours of soaking [12]. In the present work, the long BNNT have large interfacial area of contact due to small nanotube diameter, and longer sintering time (1 hr) may result in formation of trace amount of AlB$_2$ and AlN.

Tensile Properties

Figure 4:
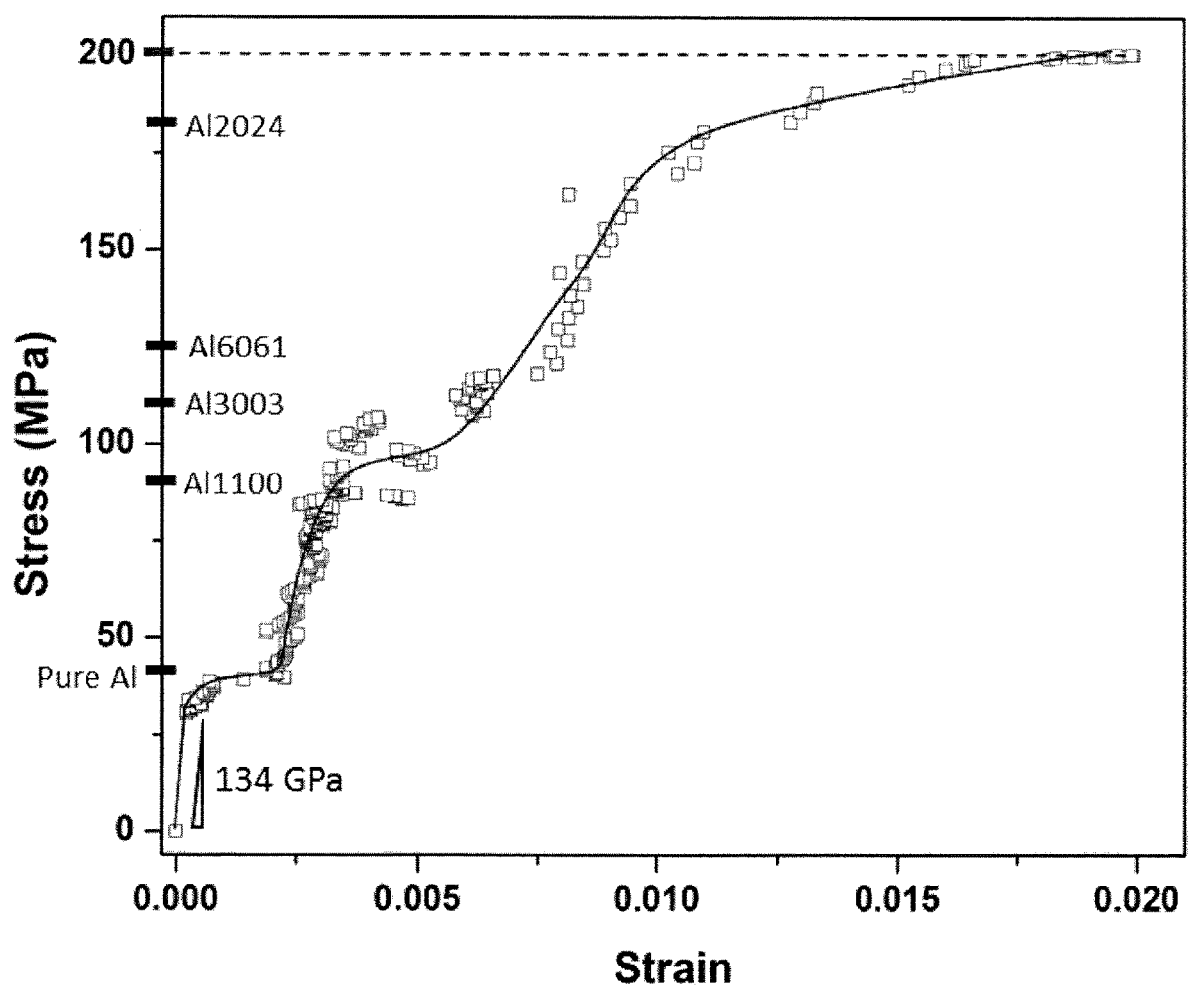
FIG. 4 depicts the tensile stress-strain behavior for the aluminum-boron nitride nanotube composite, showing multi-stage yielding and significant strengthening by the directionally aligned boron nitride nanotubes.

A tensile stress-strain plot for the aluminum-boron nitride nanotube composite is shown in FIG. 4. The BNNT reinforcement resulted in an impressive 400% increase in composite tensile strength to 200 MPa, as compared to modest tensile strength of just 40 MPa for pure Al [25]. The composite strength for aluminum-boron nitride nanotube composite is in fact higher than many commercial Al alloys, like Al1100 (90 MPa), Al3003 (110 MPa), Al6061 (125 MPa) and Al2024 (185 MPa) [26]. The aluminum-boron nitride nanotube composite showed a three-stage yielding. This aluminum-boron nitride nanotube composite included the Al, BNNT mat and interfacial products (AlN and AlB$_2$). While BNNT has the highest tensile and yield strength, pure Al is least strong. It can be assumed that the AlN and AlB$_2$ products formed at the interface would give a strength intermediate to Al and BNNT. Therefore, the first yield strength can be ascribed to Al, the second regime in stress-strain curve ascribed to the debonding/separation of interfacial products from the BNNT layer, and the third yield point ascribed with the sandwiched BNNTs. Although the tensile strength of individual nanotube has been reported to be ~61 GPa [6], the same is not realized here since the sandwiched BNNT layer consists of multiple long BNNTs held together by van der Waals attractive forces. When such loosely knit nanotubes are pulled apart, they would break at the points of interlock at comparatively lower stresses.

The elastic modulus of the aluminum-boron nitride nanotube composite was determined by computing slope of the linear initial region of stress-strain plot. Young's modulus was found to be 134 GPa (FIG. 4), which is almost double the elastic modulus of pure Al (~70 GPa) [25]. This demonstrates that the BNNTs not only improve the composite's fracture strength, but also enhances its rigidity in Hooke's law regime. The failure elongation of these composites is low at 2% strain. The most unexpected results are the significant strengthening and stiffening of these aluminum-boron nitride nanotube composites due to high aspect ratio BNNTs.

Fracture Surface Examination

Figure 5:
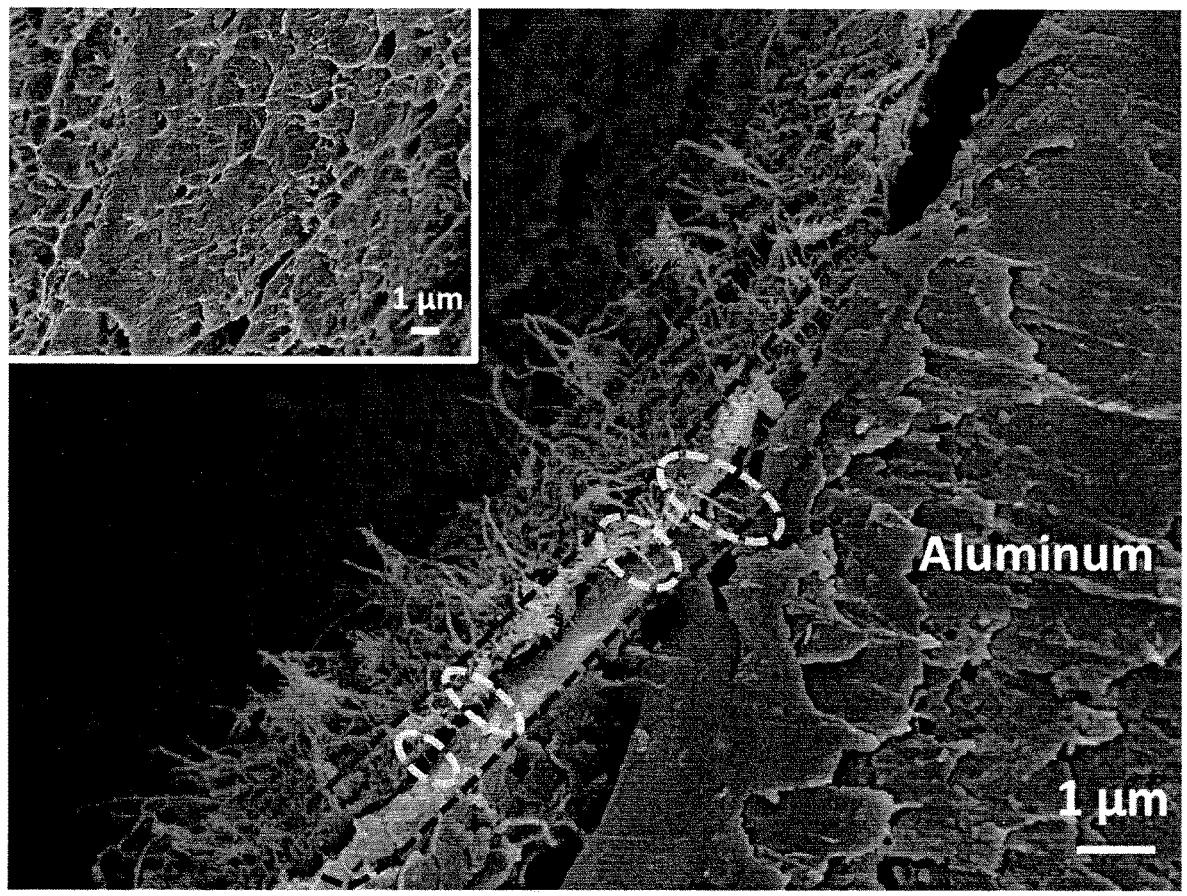
FIG. 5 is a scanning electron microscopy (SEM) image showing the aluminum-boron nitride nanotube composite at a fractured surface with the BNNTs pulled out along the tensile axis. The inset shows the typical ductile mode of failure shown by aluminum.

The SEM image of a fracture surface in FIG. 5 shows the nanotubes protruding from interface between the Al and BNNT. This image visually confirms the survival of BNNTs even after being subjected to the high temperature and pressure conditions of SPS, as well as the heavy plastic deformation induced during cold rolling. The zone enclosed by the red color in the FIG. 5 shows the interfacial region between the Al and BNNT layers. It can be seen that some of the boron nitride nanotubes act as anchors (encircled by yellow color) to link strongly with the Al layer. This is a signature of strong bonding between Al and BNNT layers. Some BNNTs are pulled out along the tensile loading direction, indicating that failure of the composite included fracture of these long nanotubes. BNNTs have been reported to have very high fracture strain, which explains significant increase in fracture strength of the composite [9]. The inset of FIG. 5 shows a typical cup and cone ductile failure signature in aluminum. While the boron nitride nanotubes fail by fracture mode, the aluminum undergoes ductile deformation. This shows that with suitable heat treatment of cold rolled sample, strain to failure can be improved in the aluminum-boron nitride nanotube composite.

Figure 6A:
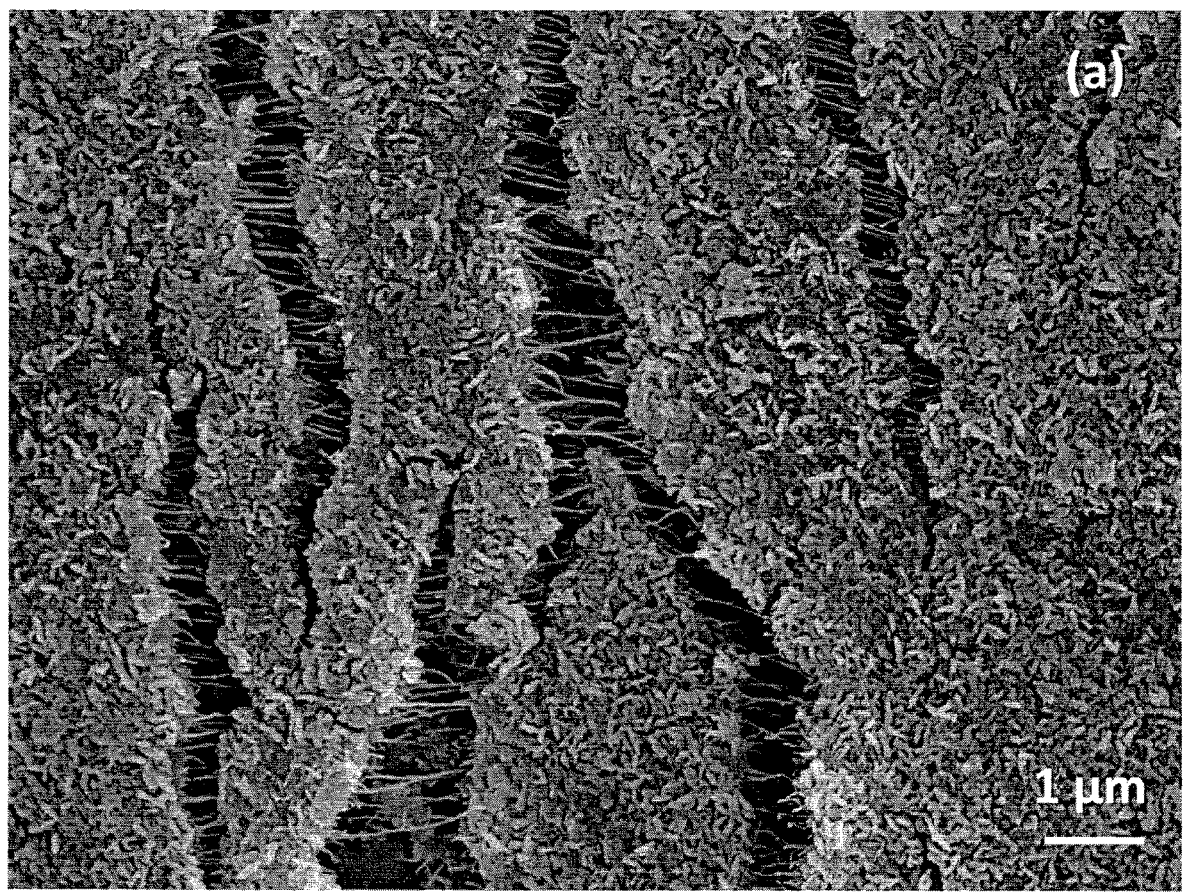
FIGS. 6A-6B are post-failure SEM images of the interface between Al and BNNT layers of the aluminum-boron nitride nanotube composite. The SEM images show.
Figure 6B:
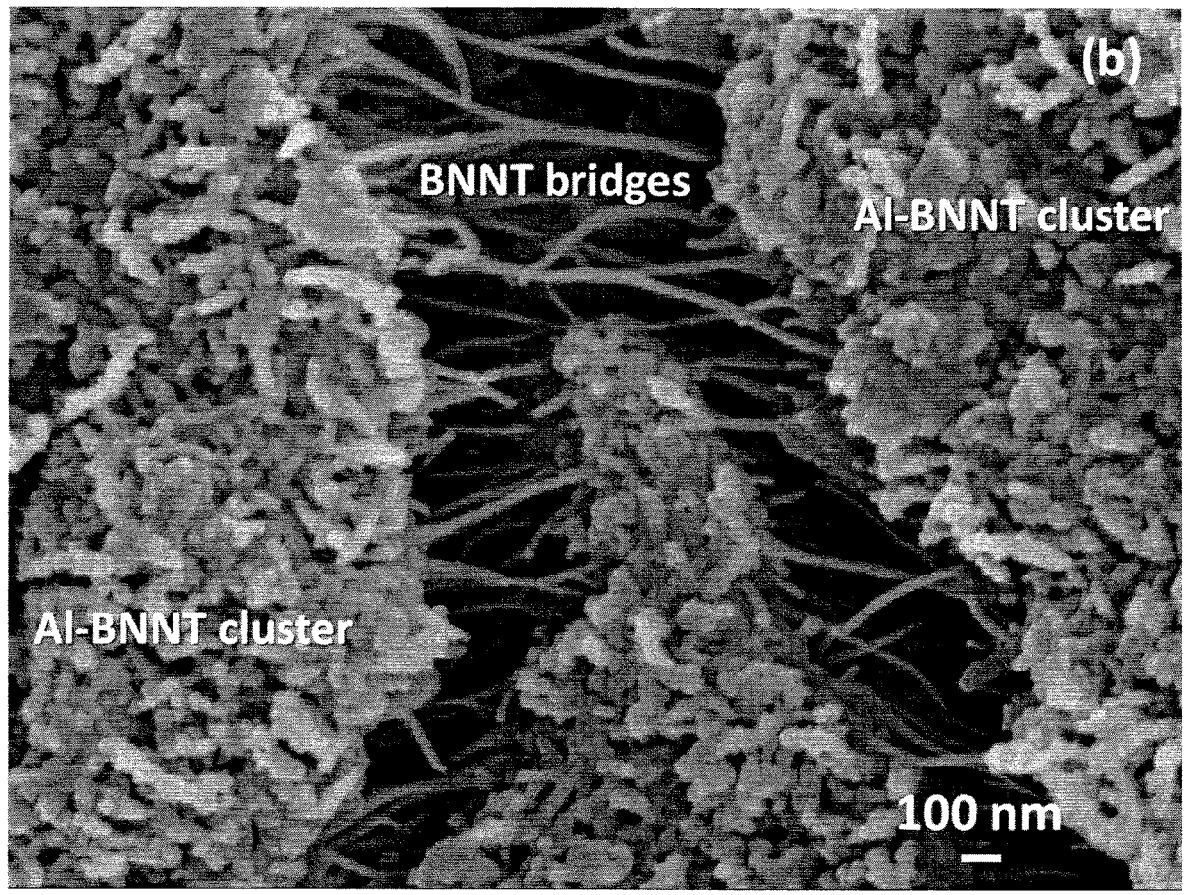

Strengthening in the aluminum-boron nitride nanotube composite can take place due to load transfer from the aluminum layer to the boron nitride nanotube. Therefore, in the post-tensile sample, the Al layer was manually delaminated, so as to expose the Al/BNNT interface of the aluminum-boron nitride nanotube composite. Scanning electron microscopy (SEM) was preformed to investigate the deformation mechanism of the exposed interface. FIG. 6A shows the pulled out nanotubes acting as crack bridges. The pulled out nanotubes bridge the Al-BNNT clusters of the aluminum-boron nitride nanotube composite ruptured due to tensile loading. These nanotubes are oriented along the tensile loading direction, which is also the cold rolling direction. Near perfect alignment of BNNTs in the desired orientation can be responsible for the strengthening in stress-strain curve (FIG. 4). FIG. 6B shows an enlarged view of Al/BNNT interface. A thin layer of sintered aluminum adhering on the BNNT can clearly be seen. Even after the tensile rupture of the aluminum-boron nitride nanotube composite, the long nanotubes hold the structure together by highly effective bridging of cracks. As can be seen from the SEM image, the nanotube connections are extensively spread across the entire depth of crack cross-section.

Figure 7:
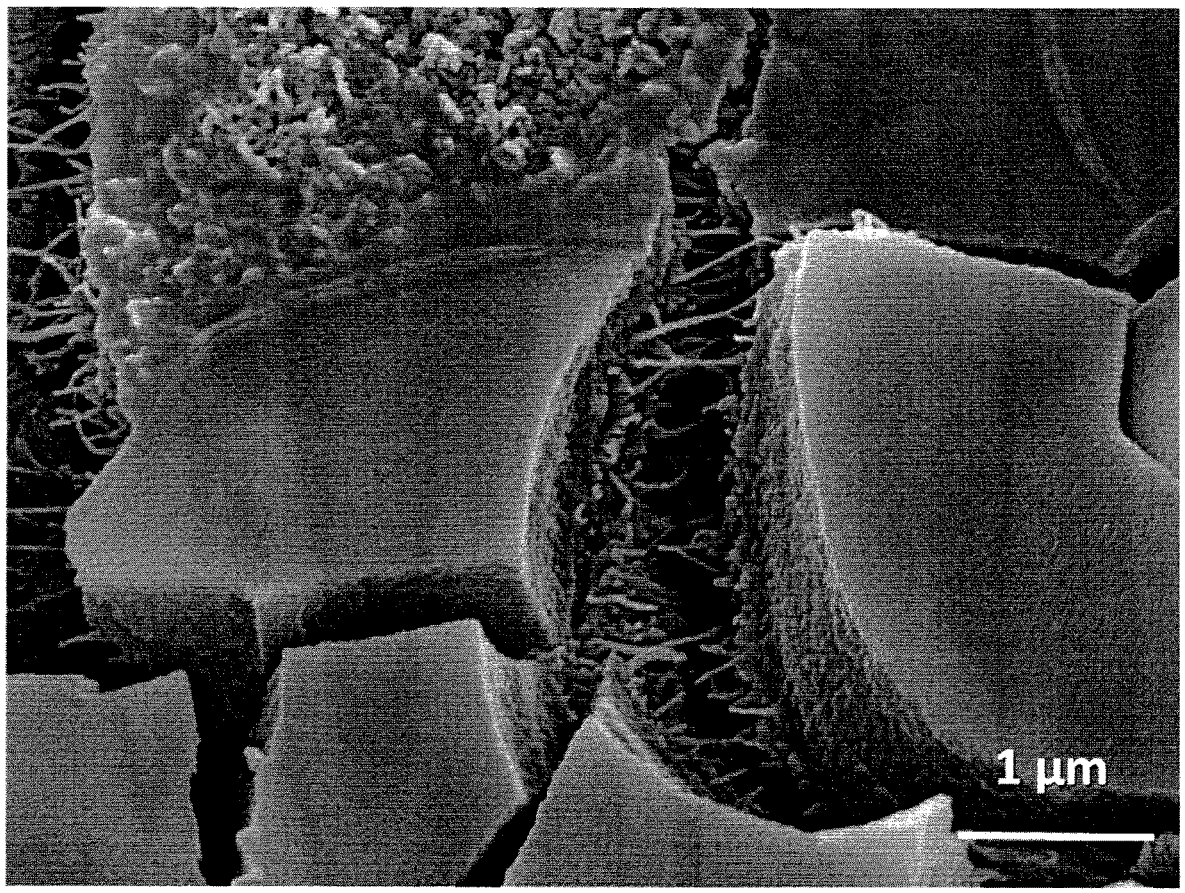
FIG. 7 is an SEM image showing the detachment of interfacial products and pulled out nanotubes along Al/BNNT interface of the aluminum-boron nitride nanotube composite after tensile failure.

In some of the regions along the Al/BNNT interface, reaction products were observed. Post-tensile SEM image of interfacial product is shown in FIG. 7. The image shows the debonding of the interfacial products from the nanotube surface. Also, some of the pulled out nanotubes bridge these interfacial products. These features can be compared to pure aluminum by the nature of failure. Characteristic ceramic style cracking was observed. The directionally aligned BNNTs can act as crack bridges, and can lead to possible toughening of interfacial layer. These SEM images corroborate the findings from stress-strain plot.

In fiber reinforced composites, load is transferred from matrix to fibers through an interfacial shear stress (shear lag model) [1]. More load transfer and better strengthening is expected when fibers are long due to higher interfacial area between fiber and matrix. At a characteristic value of length, known as critical length ($l_c$), maximum stress in the fiber at the center is equal to its fracture strength. Therefore, fiber reinforcement can be utilized to its full capability when fiber length exceeds $l_c$. The critical length is given by the Equation 1:

$$l_c = \frac{\sigma_f d}{\sigma_m} \tag{1}$$

where d is the fiber diameter, $\sigma_f$ is the fiber strength and $\sigma_m$ is the matrix strength. BNNT has a reported strength of ~61 GPa [6]. Pure Al has strength ~40 MPa [25]. BNNTs employed in this study have a reported diameter of 3-6 nm [10]. For calculation purpose, we can assume d to be the mean value, that is, 4.5 nm. Based on equation 1, critical BNNT length is obtained to be ~7 μm. BNNTs employed in this study are as long as ~200 μm, which far exceeds the calculated value of $l_c$. It is due to this reason that long BNNT reinforced sandwich composite in this study exhibited significantly enhanced mechanical properties (FIG. 4). For composites reinforced with long fibers ($l > l_c$), strength is given by Equation 2 [27]:

$$\sigma_c = \sigma_f V_f \left(1 - \frac{l_c}{2l}\right) + \sigma_m^f (1 - V_f) \tag{2}$$

where $\sigma_c$ is composite fracture strength, am is the strength of matrix at the failure strain of the composite, $V_f$ is fiber volume fraction in the composite and l is the average fiber length. Based on formula 2, it can be argued that greater the average BNNT length, higher would be the expected strengthening of composite. The SEM images of interface attest to the presence of a network of aligned long nanotubes, which explains 400% enhancement of strength for the composite hybrid (FIG. 4). This model gives a fair estimate of influence of nanotube length on composite strength. This explains why these high aspect ratio BNNTs are favorable reinforcement.

Strength of metal matrix composites strongly depends on physical-mechanical interactions as well as chemical reaction(s) taking place between the metal and the nanotubes. Aluminum adhered on the BNNT layer leads to the formation of Al-BNNT clusters, as shown in FIG. 6B. These metal-nanotube clusters can assist in load bearing [1, 28]. The BNNT with adhered the Al can be considered as a localized micro-composite by itself (but with higher fraction of nanotubes). However, these clusters fail by cracking (FIG. 6B) instead of ductile failure exhibited by the Al matrix or pure aluminum because of the higher concentration of boron nitride nanotubes. The XRD (FIG. 3) and SEM image (FIG. 7) also attest to the formation of AlN and $AlB_2$ due to reactions at the interface. Interfacial products can improve the adherence of Al matrix with nanotubes. For instance, Al and AlN have a stable orientation relationship, which strengthens the Al-BNNT bond [12]. This can lead to superior load transfer capability, which can manifest as multiple stage yielding in stress-strain plot, where the first yield point corresponds to Al yielding (inset of FIG. 5), the second regime is associated with failure of Al-BNNT clusters (FIG. 6B) and interphases (FIG. 7), and the third regime is due to nanotube bridging (FIG. 6A). The generalized shear lag model proposed by Ryu et al. [29] provides mathematical relations for matrix as well as nanotube cluster yield points. Matrix yield stress is given by Equation 3:

$$\sigma_{y,m} = \frac{V_f \sigma_m}{2} S_{eff} + \sigma_m \quad (3)$$

where $S_{eff}$ is the effective aspect ratio of an elongated nanotube cluster oriented at an angle $\theta$ to the loading direction. The average value of $S_{eff}$ given by Equation 4:

$$S_{eff,Av} = \int_0^{\pi/2} S_{eff}(\theta) F(\theta)(2\pi \sin \theta) d\theta \quad (4)$$

where $F(\theta)$ is the probability distribution function of the misorientation of the BNNT/Al clusters.

It is noteworthy that BNNTs in the aluminum-boron nitride nanotube composites are all aligned along the cold rolling direction, which can be seen in the SEM images of the interface (FIGS. 6A-B). The tensile loading direction was also similar to the rolling direction. Therefore, the value of $\theta$ can be approximated to zero. As a result, the $S_{eff}$ term would be zero too (based on Equation 4). This implies that the matrix yield point is same as the matrix strength (Equation 3). This is also corroborated by the stress-strain plot, where the first yield point is close to 40 MPa, which is also the strength of pure Al [25]. This, supports the claim that the aluminum-boron nitride nanotube composites has highly aligned nanotubes, oriented along the rolling direction, since experimental as well as theoretical values perfectly match for $\theta=0$.

The secondary yield point associated with nanotube cluster is typically modeled by simple rule of mixture formula [1]. However, the model does not take into consideration the strengthening due to the interphase(s). Since the interfacial deformation in the aluminum-boron nitride nanotube composite can be due to a combination of Al-BNNT cluster and interfacial product failure, Ryu et al.'s model [29] cannot be applied directly for secondary yield point calculations. However, from the experimental stress-strain plot shown in FIG. 4, secondary yielding associated with interfacial phenomenon takes place at about 100 MPa, which is attributed to the combined phenomena of failure of Al-BNNT cluster and reaction product debonding.

Figure 8:
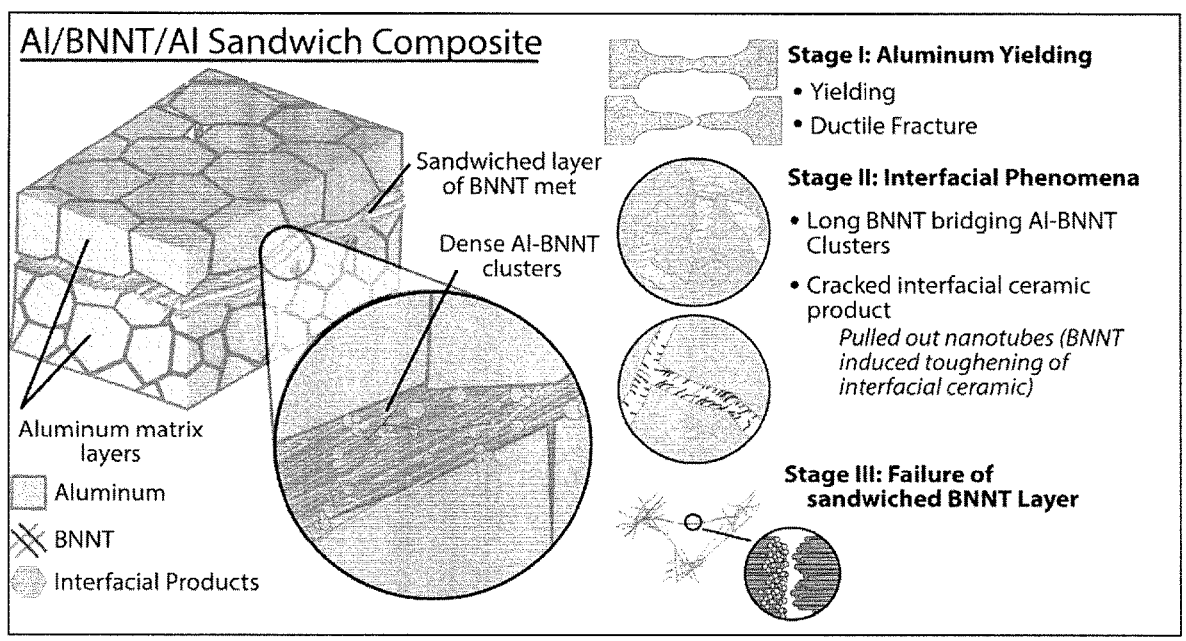
FIG. 8 is a schematic diagram summarizing the strengthening and the deformation mechanisms in the aluminum-boron nitride nanotube composite.

Tertiary yielding can occur due to the stretching of nanotubes, which leads to BNNT bridge formation as shown in FIG. 6A. These stretched boron nitride nanotubes bridge the cracked Al-BNNT clusters, shown in FIG. 6B. Yielding of directionally aligned long BNNT layer was found to initiate at~167 MPa (FIG. 4). Final rupture of the sandwiched composite took place at 200 MPa, due to fracture failure of the nanotubes (FIG. 5). Strengthening and deformation mechanisms in this composite are summarized schematically in FIG. 8.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility. It is therefore intended by the appended claims to cover any and all such applications, modifications and embodiments within the scope of the present invention.

Various terms have been defined above. To the extent a term used in a claim is not defined above, it should be given the broadest definition persons in the pertinent art have given that term as reflected in at least one printed publication or issued patent.

As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising". The transitional terms/phrases (and any grammatical variations thereof) "comprising," "comprises," "comprise," "consisting essentially of," "consists essentially of," "consisting," and "consists" can be used interchangeably.

The term "about" means within an acceptable error range for the particular value as determined by one of ordinary skill in the art, which will depend in part on how the value is measured or determined, i.e., the limitations of the measurement system. For example, "about" can mean within 1 or more than 1 standard deviation, per the practice in the art. Alternatively, "about" can mean a range of up to 0-20%, 0 to 10%, 0 to 5%, or up to 1% of a given value. Where particular values are described in the application and claims, unless otherwise stated the term "about" meaning within an acceptable error range for the particular value should be assumed. In the context of compositions containing amounts of ingredients where the terms "about" or "approximately" are used, these compositions contain the stated amount of the ingredient with a variation (error range) of 0-10% around the value (X±10%).

In the present disclosure, ranges are stated in shorthand, so as to avoid having to set out at length and describe each and every value within the range. Any appropriate value within the range can be selected, where appropriate, as the upper value, lower value, or the terminus of the range. For example, a range of 0.1-1.0 represents the terminal values of 0.1 and 1.0, as well as the intermediate values of 0.2, 0.3, 0.4, 0.5, 0.6, 0.7, 0.8, 0.9, and all intermediate ranges encompassed within 0.1-1.0, such as 0.2-0.5, 0.2-0.8, 0.7-1.0, etc. Values having at least two significant digits within a range are envisioned, for example, a range of 5-10 indicates all the values between 5.0 and 10.0 as well as between 5.00 and 10.00 including the terminal values.

As used herein, the use of the singular includes the plural unless specifically stated otherwise. The use of "or" means "and/or" unless stated otherwise. As used herein, use of the term "including" as well as other forms, such as "includes," and "included," is not limiting.

As used herein, "optional" or "optionally" means that the subsequently described event or circumstance does or does not occur, and that the description includes instances where the event or circumstance occurs and instances where it does not. For example, an optional component in a system means that the component may be present or may not be present in the system.

All patents, patent applications, provisional applications, and publications referred to or cited herein are incorporated by reference in their entirety, including all figures and tables, to the extent they are not inconsistent with the explicit teachings of this specification.

REFERENCES

1. A. Agarwal, S. R. Bakshi, D. Lahiri, Carbon Nanotubes Reinforced Metal Matrix Composites, CRC Press, New York (2011).
2. S. R. Bakshi, D. Lahiri, A. Agarwal, Inter. Mater. Rev. 55 (2010) 41.
3. S. R. Bakshi, A. Agarwal, Carbon 49 (2011) 533.
4. D. Golberg, Y. Bando, C. Tang, C. Zhi, Adv. Mater. 19 (2007) 2413.
5. A. P. Suryavanshi, M. F. Yu, J. Wen, C. Tang, Y. Bando, Appl. Phys. Lett. 84 (2004) 2527.
6. R. Arenal, M.-S. Wang, Z. Xu, A. Loiseau, D. Golberg, Nanotechnology 22 (2011) 265704.
7. Y. Chen, J. Zou, S. J. Campbell, G. Le, Appl. Phys. Lett. 84 (2004) 2430.
8. D. Golberg, Y. Bando, K. Kurashima, T. Sato, Scr. Mater. 44(2001) 1561.
9. H. M. Ghassemi, C. H. Lee, Y. K. Yap, R. S. Yassar, Nanotech. 22 (2011) 115702.
10. A. L. Tiano, C. Park, J. W. Lee, H. H. Luong, L. J. Gibbons, S.-H. Chu, S. I. Applin, P. Gnoffo, S. Lowther, H. J. Kim, P. M. Danehy, J. A. Inman, S. B. Jones, J. H. Kang, G. Sauti, S. A. Thibeault, V. Yamakov, K. E. Wise, J. Su, C. C. Fay, Boron Nitride Nanotube: Synthesis and Applications, NASA Technical Reports Server (NTRS), Document ID: 20140004051 (2014).
11. S. K. Singhal, A. K. Srivastava, R. Pasricha, R. B. Mathur, J. Nanosci. Nanotech. 11 (2011) 5179.
12. D. Lahiri, V. Singh, L. H. Li, T. Xing, S. Seal, Y. Chen, A. Agarwal, J. Mater. Res. 27 (2012) 2760.
13. M. Yamaguchi, D.-M. Tang, C. Zhi, Y. Bando, D. Shtansky, D. Golberg, Acta Mater. 60 (2012) 6213.
14. E. A. Obraztsova, D. V. Shtansky, A. N. Sheveyko, M. Yamaguchi, A. M. Kovalskii, D. Golberg, Scr. Mater. 67 (2012) 507.
15. D. Lahiri, A. Hadjikhani, C. Zhang, T. Xing, L. H. Li, Y. Chen, A. Agarwal, Mater. Sci. Eng. A 574 (2013) 149.
16. M. Yamaguchi, A. Pakdel, C. Zhi, Y. Bando, D.-M. Tang, K. Faerstein, D. Shtansky, D. Golberg, Nano Res. Lett. 8 (2013) 3.
17. M. Yamaguchi, F. Meng, K. Firestein, K. Tsuchiya, D. Golberg, Mater. Sci. Eng. A 604 (2014) 9.
18. Y. Xue, B. Jiang, L. Bourgeois, P. Dai, M. Mitome, C. Zhang, M. Yamaguchi, A. Matveev, C. Tang, Y. Bando, K. Tsuchiya, D. Golberg, Mater. Des. 88 (2015) 451.
19. U. Anselmi-Tamburini, J. E. Garay, Z. A. Munir, A. Tacca, F. Maglia, G. Spinolo, J. Mater. Res. 19 (2004) 3255.
20. N. Hansen, Scr. Mater. 51 (2004) 801.
21. D. M. Tang, C. L. Ren, X. L. Wei, M. S. Wang, C. Liu, Y. Bando, D. Golberg, ACS Nano 5 (2011) 7362.
22. X. L. Wei, M. S. Wang, Y. Bando, D. Golberg, Adv. Mater. 22 (2010) 4895.
23. T. H. Ferreira, P. R. O. da Silva, R. G. dos Santos, E. M. B. de Sousa, J. Biomater. Nanobiotech. 2 (2011) 426.
24. T. L. Hedrick, Bioinsp. Biomim. 3 (2008) 034001.
25. I. Polmear, Light alloys: metallurgy of the light metals, 3$^{rd}$ Ed., Oxford: Butterworth-Heinemann (1995).
26. J. G. Kaufman, Properties of Aluminum Alloys: Tensile, Creep, and Fatigue Data at High and Low Temperatures, The Aluminum Association and ASM International, Materials Park, Ohio (1999).
27. T. Kuzumaki, K. Miyazawa, H. Ichinose, K. Ito, J. Mater. Res. 13 (1998) 2445.
28. K. T. Kim, S. I. Cha, S. H. Hong, S. H. Hong, Mater. Sci. Eng. A 430 (2006) 27.
29. H. J. Ryu, S. I. Cha, S. H. Hong, J. Mater. Res. 18 (2003) 2851.

We claim:

1. An aluminum-boron nitride nanotube-aluminum (Al-BNNT-Al) multi-layer composite comprising:
   i) a top metal matrix layer of consolidated Aluminum (Al);
   ii) a mat of interconnected boron nitride nanotubes (BNNTs) forming a core layer of the Al-BNNT-Al multi-layer composite, the mat of interconnected BNNTs comprising long BNNTs having a length of about 100 μm to about 300 μm forming a BNNT network;
   iii) a bottom metal matrix layer of consolidated Al; and
   iv) a layer between each metal matrix layer and the mat of interconnected BNNTs, said layer comprising interfacial products formed by chemical reactions between Al and the BNNTs, and Al-BNNT clusters, Al-BNNT clusters comprising BNNTs with Al grains adhered on the BNNTs;
   the Al-BNNT-Al multi-layer composite having a sandwich structure with the mat of interconnected BNNTs sandwiched between the top and bottom metal matrix layers;
   the Al-BNNT-Al multi-layer composite exhibiting three-stage yielding and having about 400% increase in tensile strength compared to that of pure Al.

2. The Al-BNNT-Al composite of claim 1, characterized in that the boron nitride nanotubes have a length of about 190 μm to about 210 μm.

3. The Al-BNNT-Al composite of claim 1, characterized in that the boron nitride nanotubes have an aspect ratio of about 30,000 to about 75,000.

4. The Al-BNNT-Al composite of claim 1, characterized in that 80% of the boron nitride nanotubes are aligned and deviate less than ±9° from a reference line parallel to the boron nitride nanotubes.

5. The Al-BNNT-Al composite of claim 1, characterized in that the Al-BNNT-Al composite has a tensile strength of about 100 MPa to about 600 MPa.

6. The Al-BNNT-Al composite of claim 1, characterized in that the Al-BNNT-Al composite has a Young's modulus from about 100 GPa to about 160 GPa.

7. The Al-BNNT-Al composite of claim 1, characterized in that the boron nitride nanotubes have an elastic modulus equal to or greater than about 1 TPa.

8. The Al-BNNT-Al composite of claim 1, characterized in that the Al-BNNT-Al composite comprises BNNT anchors linking each of the top and bottom metal matrix layers and the mat of interconnected BNNTs.

9. The Al-BNNT-Al composite of claim 1, characterized in that the Al-BNNT-Al multi-layer composite consisting of:
   i) a top metal matrix layer of consolidated Aluminum (Al);
   ii) a mat of interconnected boron nitride nanotubes (BNNTs) forming a core layer of the Al-BNNT-Al multi-layer composite, the mat of interconnected BNNTs comprising long BNNTs having a length of about 100 μm to about 300 μm;
   iii) a bottom metal matrix layer of consolidated Al; and
   iv) a layer between each metal matrix layer and the mat of interconnected BNNTs, said layer comprising interfacial products formed by chemical reactions between Al and the BNNTs, and Al-BNNT clusters, Al-BNNT clusters comprising BNNTs with Al grains adhered on the BNNTs;

the Al-BNNT-Al multi-layer composite having a sandwich structure with the mat of interconnected BNNTs sandwiched between the top and bottom metal matrix layers, the Al-BNNT-Al composite exhibiting three-stage yielding and having a tensile strength of about 195 MPa to about 205 MPa with about 1.5 vol % to about 2.5 vol % BNNTs.

10. The Al-BNNT-Al composite of claim 1, characterized in that the Al-BNNT-Al composite comprises about 1.5 vol % to about 2.5 vol % BNNTs.

11. An aluminum-boron nitride nanotube-aluminum (Al-BNNT-Al) composite prepared by a process comprising the steps of:

at least partially coating a mat of interconnected boron nitride nanotubes with aluminum powder to make an aluminum-boron nitride nanotube layered structure, the at least partially coating being performed by sputter deposition, and the boron nitride nanotubes having a length of about 100 μm to about 300 μm;

sintering the aluminum-boron nitride nanotube layered structure to make an aluminum-boron nitride nanotube pellet, the sintering being performed by spark plasma sintering; and rolling the aluminum-boron nitride nanotube pellet to make the Al-BNNT-Al composite, the rolling being cold rolling;

the Al-BNNT-Al composite having a sandwich structure with a layer of the mat of interconnected BNNTs sandwiched between two Al layers, the Al-BNNT-Al composite comprising a layer between each Al layer and the mat of interconnected BNNTs, said layer comprising interfacial products formed by chemical reactions between aluminum and the boron nitride nanotubes, and Al-BNNT clusters, Al-BNNT clusters comprising BNNTs with Al grains adhered on the BNNTs, the Al-BNNT-Al composite comprising BNNT anchors linking each of the Al layers and the mat of interconnected BNNTs, and the Al-BNNT-Al composite exhibiting three-stage yielding and having about 400% increase in tensile strength compared to that of pure Al.

12. The Al-BNNT-Al composite of claim 11, characterized in that the boron nitride nanotubes have an aspect ratio of about 30,000 to about 75,000.

13. The Al-BNNT-Al composite of claim 11, characterized in that 80% of the boron nitride nanotubes are aligned and deviate less than ±9° from a reference line parallel to the boron nitride nanotubes.

14. The Al-BNNT-Al composite of claim 11, characterized in that the Al-BNNT-Al composite has a tensile strength of about 190 MPa to about 230 MPa.

15. The Al-BNNT-Al composite of claim 11, characterized in that the Al-BNNT-Al composite has a Young's modulus from about 100 GPa to about 160 GPa.

* * * * *